United States Patent [19]

Brent

[11] Patent Number: 4,943,946

[45] Date of Patent: Jul. 24, 1990

[54] CONTROL SYSTEM FOR CHAINED CIRCUIT MODULES

[75] Inventor: Michael Brent, London, England

[73] Assignee: Anamartic Limited, Milton, Mass.

[21] Appl. No.: 27,167

[22] PCT Filed: Jul. 11, 1986

[86] PCT No.: PCT/GB86/00401

§ 371 Date: Mar. 12, 1987

§ 102(e) Date: Mar. 12, 1987

[87] PCT Pub. No.: WO87/00675

PCT Pub. Date: Jan. 29, 1987

[30] Foreign Application Priority Data

Jul. 12, 1985 [GB] United Kingdom ............... 8517699

[51] Int. Cl.[5] .................... G11C 7/00; G06F 1/00
[52] U.S. Cl. ..................... 365/189.12; 365/230.03; 364/900; 364/926.92
[58] Field of Search ............ 364/200 MS, 900 MS; 365/78, 240, 189.07, 189.12, 230.03

[56] References Cited

U.S. PATENT DOCUMENTS

| | | | |
|---|---|---|---|
| 3,882,470 | 5/1975 | Hunter | 364/900 |
| 3,913,072 | 10/1975 | Catt | 364/200 |
| 3,972,031 | 7/1976 | Riemenschneider et al. | 365/78 |
| 4,038,648 | 7/1977 | Chesley | 364/900 |
| 4,489,397 | 12/1984 | Lee | 364/900 |
| 4,493,055 | 1/1985 | Osman | 365/78 |
| 4,519,035 | 5/1985 | Chamberlain | 364/200 |
| 4,528,647 | 7/1985 | Chamberlain | 364/900 |

OTHER PUBLICATIONS

R. Veit, "Increased Packing Density of Monolithic Storages", IBM Tech. Disc. Bull., vol. 13, No. 8, Jan. 1971 (New York).

G. Elie et al., "Multipoint Without Address", IBM Tech. Disc. Bull., vol. 25, No. 8, Jan. 1983 (New York).

*Primary Examiner*—Eddie P. Chan
*Assistant Examiner*—Rebecca L. Rudolph
*Attorney, Agent, or Firm*—Robert F. O'Connell

[57] ABSTRACT

A wafer-scale integrated circuit comprises a few hundred modules which can be connected into a long chain by commands sent to the modules along a transmit path set up by way of module inputs XINN, XINE, XINS, XINW from neighbouring modules and outputs thereto XOUTN, XOUTE, XOUTS, XOUTW, only one of which is enabled to by one of four selection signals SELN, SELE, SELS, SELW acting both on transmit path logic and on receive path logic in a return path. A RAM unit can be enabled by WRITE to write a block of data sent to RID via the transmit path and can be enabled by READ to read a block of data to ROD for return along the return path. The provision of SELN, etc. READ and WRITE is effected by configuration logic which includes a shift register and is responsive to a command mode signal CMND, on a line which runs to all modules in parallel. If, when CMND is asserted the bit currently in the transmit path is logic (, the module is not addressed. IF the bit is 1, the modules is addressed and the bit is latched as a token within the XMIT path logic. The configuration logic then clocks the 1 bit token along its shift register until CMND goes low again. The first six stages of the shift register provide SELN, SELE, SELS, SELW, READ and WRITE respectively and the position of the token when CMND goes low determines which command is generated. The shift register has further stages for providing a signal ACR to reset an address counter in the RAM unit and for toggling RPON which controls the power supply to the RAM unit via a transistor switch.

21 Claims, 11 Drawing Sheets

CONTROL SYSTEM FOR CHAINED CIRCUIT MODULES

The present invention relates to a control system for chained circuit modules. It is known to connect a plurality of circuit modules in a chain, each module being capable of performing some memory and/or data processing operation. In particular, the circuit modules may be undiced chip areas of an integrated circuit wafer and the chain of modules may be grown by actuation of electronic switching functions within the modules, as described in GB 1 377 859. The chain may be single (and approximate a spiral) or may be branched.

As described in GB 1 377 859 it is necessary to be able to send commands to the circuit modules individually. The commands are used in controlling the growth of the chain and also in controlling operations carried out using the circuit modules. For example, it may be necessary to command the writing of data to or the reading of data from a memory module. A module may be regarded as composed of a function unit, which performs the memory or data processing operation proper of the unit, and control logic which responds to commands. Various techniques have been suggested for addressing commands to individual modules. Each module may be given its own address and commands can include address fields, whereby associative addressing is employed. This provides completely flexible addressing (any command can be sent to any module in the chain) but suffers from the disadvantages that every module has to be set up with its own address and the control logic is relatively complex. An improved proposal (see again GB 1 377 859) utilises an address number in each command. As the command passes from module to module, the address number is decremented or incremented until a predetermined number is reached (e.g. zero), whereupon the command is executed by the module at which this event occurs. This avoids the need to set up modules with individual addresses but the control logic is still relatively complex.

Another idea proposed in GB 1 377 859 is to issue a global command to all modules. Such a command is issued by way of a global line, that is to say a line running to all modules in parallel, in contrast to lines chained through the modules. Other global lines can include power and clock lines. A module performs a specific function when it receives the global command and the module is concurrently receiving a specific state signal from an adjacent module. In GB 1 377 859 this is proposed as part of the mechanism for growing the chain of modules. It is of extremely limited application, enabling one particular command to be sent only to the end of the chain. In use of the chain of modules, it is obviously necessary to be able to address various commands to modules anywhere along the chain.

An important consideration in the case of chained modules is the integrity of the chaining paths between modules. These include part of the control logic of each module and this part will be called the serial logic. The control logic will additionally include side-chain logic, that is to say logic which is branched off the path through which the modules are chained. Any defect in the serial logic of a module will break the chain and render the apparatus inoperable. Particularly when the modules are undiced chip areas, i.e. parts of a wafer scale integration (WSI) system, there is a high premium on keeping the serial logic as simple as possible. As is well known, a significant problem in WSI is avoidance of faulty modules. It is advantageous to be able to utilise the serial logic of a faulty module (provided the serial logic is functioning) even although the function unit of the module is not used, and may even be disabled, because it is faulty. The use of good serial logic of otherwise faulty modules makes it possible to grow chains more efficiently and include within the chain a higher proportion of non-faulty modules than if the chain excludes a module which is in any way faulty, (which is the approach adopted in GB 1 377 859).

The object of the present invention is to provide a control system which enables flexible addressing to be achieved using relatively simple control logic.

A more specific object of the preferred implementation of the invention is to enable flexible addressing to be achieved with extremely simple serial logic.

According to the invention in its broadest aspect there is provided a control system for chained circuit modules, each of which can execute a selected one of a repertoire of commands, wherein each module includes a shift register arrangement responsive to clock pulses provided to all modules in the chain, all modules are connected to a global command line, and each module is operative to execute a selected command on receipt of a command signal on the global command line when a token is then present in its shift register arrangement, the command selection being at least partially determined by the position of the token within the shift register arrangement.

The token could consist of more than one bit and the selection of a command could then be determined in part by the location of the token and in part by a decode of the token itself. However, it is preferred to use a single bit token (such as a "1" in a stream of zeroes) and to make command selection dependent solely upon the location of the token when the global command signal is received. Further description will proceed in accordance with use of a single bit token, i.e. a token bit.

A straightforward but non-preferred implementation of the invention will firstly be described. If the repertoire of commands comprises commands 1 ... j... m where m may be 8 for example, each module can include an m-bit shift register in its serial logic. To cause the $i^{th}$ module to implement the $j^{th}$ commands, a token bit is launched down the chain of modules and, after $(i \times m) + j$ clock pulses the token bit will be in the $j^{th}$ command bit of the $i^{th}$ module. The global command is then issued to all modules. Because of the location of the token bit, the $i^{th}$ module executes the $j^{th}$ command.

The above implementation suffers from two drawbacks. The serial logic is more extensive than is desirable (compare the above comments) and the latency for command execution is high. There may be some hundreds of modules in the chain and, if $i = 100$ and $m = 8$, it takes 792 clock pulses to get a token bit to the $i^{th}$ module.

In accordance with an important development of the invention, the shift register arrangement is mainly or wholly in the side-chain logic. The serial logic includes very few, preferably only one, bit buffer stages. Two global command signals are now required. The first causes a token to be seized at a module and to be clocked down its side-chain shift register arrangement. The second causes the module in question to execute a command in dependence upon its position which the token has reached along the side-chain shift register arrangement. The first and second global command signals could be provided by way of separate global lines but it is much preferred to use a single global line and to provide both signals on this line. Again the preferred technique is to represent one signal by asserting a particular logic level and to represent the second signal by terminating this assertion. In the embodiment to be described below the first signal is given when CMND goes true, the second when CMND reverts to false.

When a token is seized at a module it may be arrested in that module until the second signal, when it may be allowed to proceed to more remote modules; this is the option selected in the embodiment described below. Alternatively the token may be seized "on the fly" and be allowed to continue on its way for use on a subsequent assertion of the first signal.

Assuming there to be only a single bit buffer in the serial logic of each module, the latency in executing the $j^{th}$ command at the $i^{th}$ module is only $i+j$ clock pulses.

The invention will be described in more detail, by way of example, with reference to the accompanying drawings.

Figure 1:
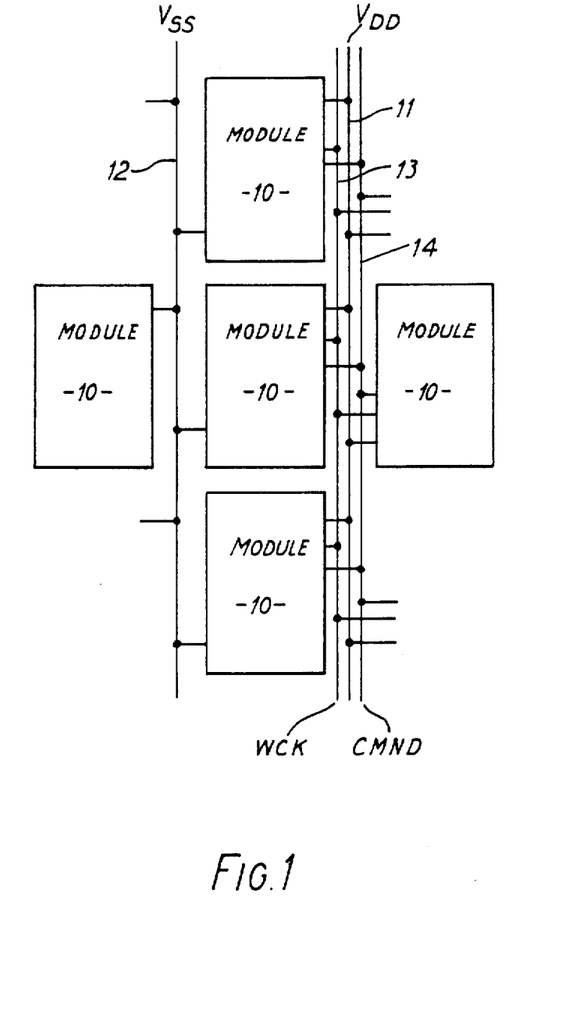
FIG. 1 shows part of a WSI circuit including global lines.

FIG. 1 shows a few modules 10 on a wafer which may contain a few hundred modules arranged on the wafer. The modules are set in a grid of global lines, namely a $V_{DD}$ power line 11, a $V_{SS}$ power line 12, a WCK (wafer clock) line 13 and a CMND (command) line 14. All these lines go to bondsites on the edge of the wafer or WCK and CMND may go to a command module on the wafer.

Figure 2:
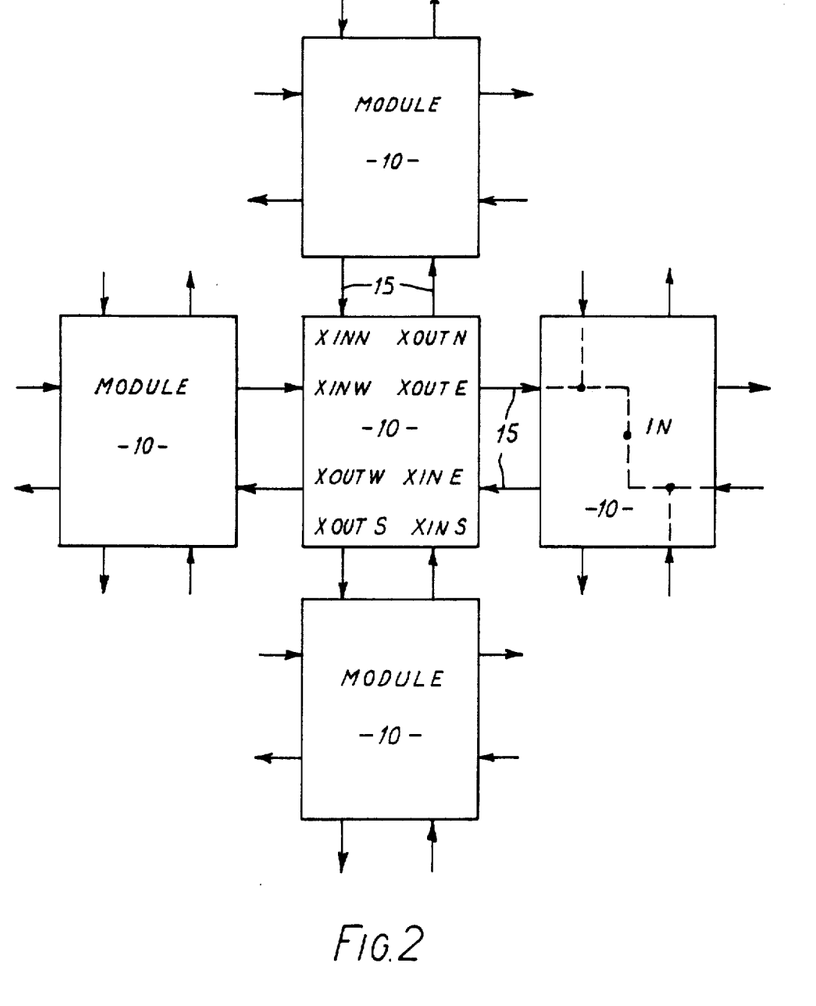
FIG. 2 shows part of a WSI circuit but shows the transmit path inter-module lines.

FIG. 2 shows the same modules 10 minus the global lines but with inter-module lines 15 for transmit paths. Data may be sent through a chain of modules, starting at a bondsite identified as XMIT (transmit; not shown). The modules have four connections into their XMIT path and these connections are identified as follows:

XINN from module above
XINE from module to right
XINS from module below
XINW from module to left As shown in the right hand module only, these XIN lines merge into a single XIN terminal.

The modules have four connections out from their XMIT paths and . these connections are identified as follows:

XOUTN to module above
XOUTE to module to right
XOUTS to module below
XOUTW to module to left.

Unlike the XIN lines, these output lines are switched so that a module can select only one of its edge neighbours as the next module in the chain, on to which XMIT data is passed.

The modules are also connected by receive path inter-module lines 16 (FIG. 3) which allow data to be sent back to a bondsite identified as RECV (not shown).

Figure 3:
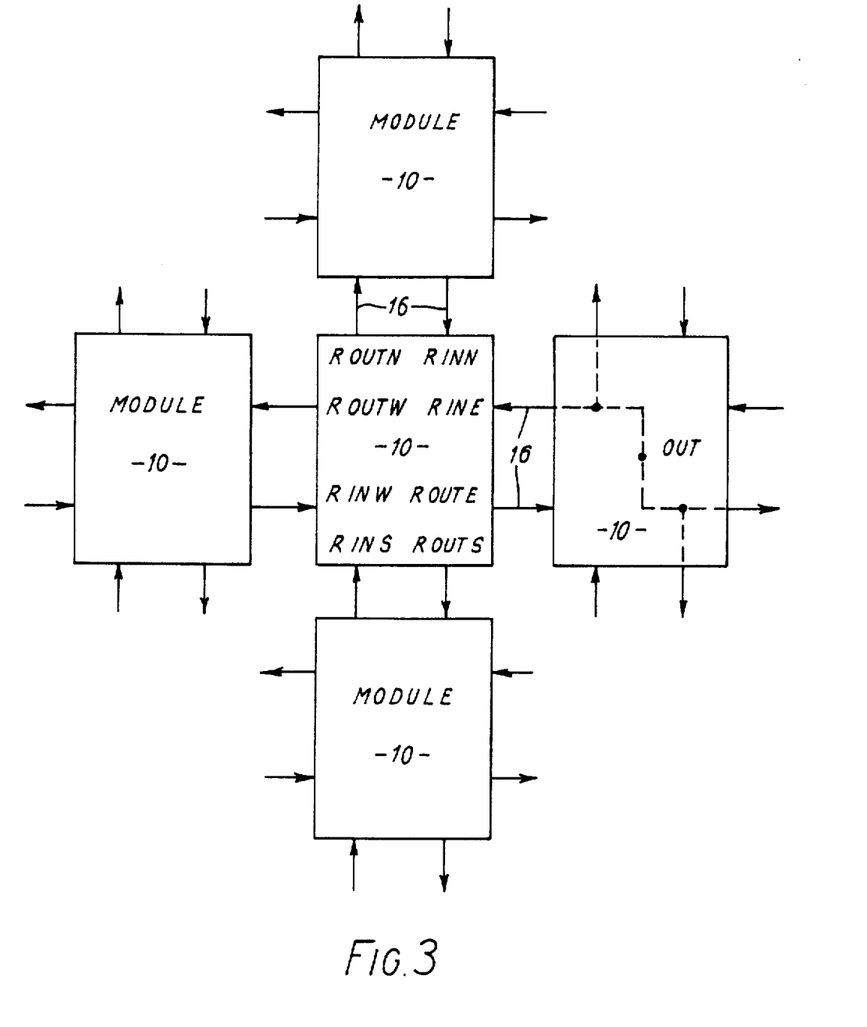
FIG. 3 is similar to FIG. 2 but shows the receive path intermodule lines.

The modules have four connections into their RECV paths:

RINN from module above
RINE from module to right
RINS from module below
RINW from module to left.

These connections are switched in correspondence with XOUT connections.

The modules have four connections out of their RECV paths:

ROUTN to module above
ROUTE to module to right
ROUTS to module below
ROUTW to module to left.

These connections branch, without switching, from an OUT terminal, so that return data is broadcast to all four neighbours, only one of which will have been set up to receive it.

The XOUT and RIN selections are effected by four selection signals SELN, SELE, SELS and SELW, whose generation is explained below. Only one of these signals can be true. If SELN is true, for example, the module routes the XMIT path to the adjacent module above and accepts RECV data from that module.

The SEL signals of the modules are set up basically as described in GB 1 377 859. Modules are added one by one to the chain, tested and retained if good, and the procedure is reiterated to grow a chain of interconnected modules. The chain tends to spiral in to the centre of the wafer in the case of a peripheral bondsite for XMIT and RECV. There may be a plurality of such bondsites, say four, to improve the chance of finding a good place to start the chain. The testing is effected in stages in the present system, as described further below.

Figure 4:
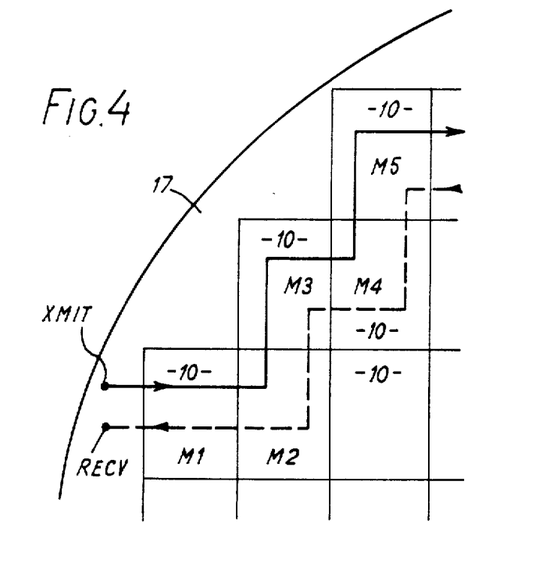
FIG. 4 illustrates how a chain of modules is formed at the edge of a wafer.

FIG. 4 illustrates a peripheral fragment 17 of a wafer with modules 10 and the bondsite terminals XMIT and RECV. Portions of the XMIT path and RECV path are shown in full and broken lines respectively, as they would be grown through modules in accordance with the algorithm that each module tries its selection options in the order SELN, SELE, SELS and SELW. The first module M1 fails with SELN (there is no module above it) but succeeds with SELE, so adding M2 to the chain. M2 succeeds with SELN and adds M3. M3 fails with SELN but succeeds with SELE, to add M4. M5 succeeds with SELN to add M5, and so on. In the example shown all modules are good, at least so far as their control logic is concerned.

Before turning to a full description of a module 10, a brief summary of the way in which it operates will be given. Normally the module merely acts as a link in the chain and outbound data and commands pass from XMIT through the XMIT path in the module with a 1-bit delay through each module. Inbound data returns to RECV through the RECV path in the module, also with a 1-bit delay through each module. Each module, contains a 16 k×1 bit dynamic RAM unit which is constantly refreshed under control of a free-running address counter. The module also contains control logic which can respond to commands to effect SELN, SELE, SELLS and SELW and to other commands of which the most important are READ and WRITE. When a module receives either of these commands, the chain is broken at that module and the RAM unit is written to in the case of WRITE and read from in the case of READ. Although the RAM unit is composed of random access blocks it is only addressed by the free running counter and treated as a 16k block of serial memory. In a READ operation, all 16k of memory are read out on to the RECV line. If the read command is timed correctly in relation to the address counter cycle, the memory block will be read out correctly starting from address O and running through to address ($2^{16}$—1). If the READ command is not thus timed, the data will be "wrapped round"—in an address order N, ..., ($2^{16}$—i), O, ..., (N-1) where N is the address obtaining at the READ command. The data can be accepted in this order to RECV and then cyclically shifted to establish the correct address order.

In a WRITE operation 16k of data is written from XMIT into the RAM unit. The command and ensuring data can either be correctly timed in relation to the address counter cycle or can be pre-wrapped-round to match the address N at which the write starts. Another possibility is to write regardless and store the value in the address counter cycle marking the start of the written block, this stored value being used when the block is read to enable it to be correctly unwrapped.

After a read or a write operation, assuming that communication is then required to the more remote modules, it is necessary to send the appropriate SEL command to the module to re-establish the chain and it is accordingly necessary to maintain a record of the SEL command required by each module. Thus a table is established during initial testing and preferably then frozen in a PROM. This table identifies the modules simply by their number along the chain and provides information of the following kind,.to take the example of FIG. 4:

| ENTRY | SEL | OFFSET | FLAG |
|-------|-----|--------|------|
| M1    | E   |        |      |
| M2    | N   |        |      |
| M3    | E   |        |      |
| M4    | N   |        |      |
| M5    | E   |        |      |

ENTRY is the table address. SEL requires two bits (e.g. 00 =SELN, 01=SELE 10=SELS and 11 SELW) OFFSET gives the number in the module's address counter at a datum address cycle time, corrected to take account of the time taken to access the module (1-bit delay through each preceding module). FLAG is a single bit which indicates whether the RAM unit of the module is usable.

It is not essential to know OFFSET. If a data block includes a suitable framing word 16k blocks may be written and read without regard to wrap-round. After reading a block it may be "unwrapped" by finding the framing word.

A more detailed description of a module will now be give with an explanation as to how the aforementioned facilities are provided and other features of the preferred embodiment.

Figure 5:
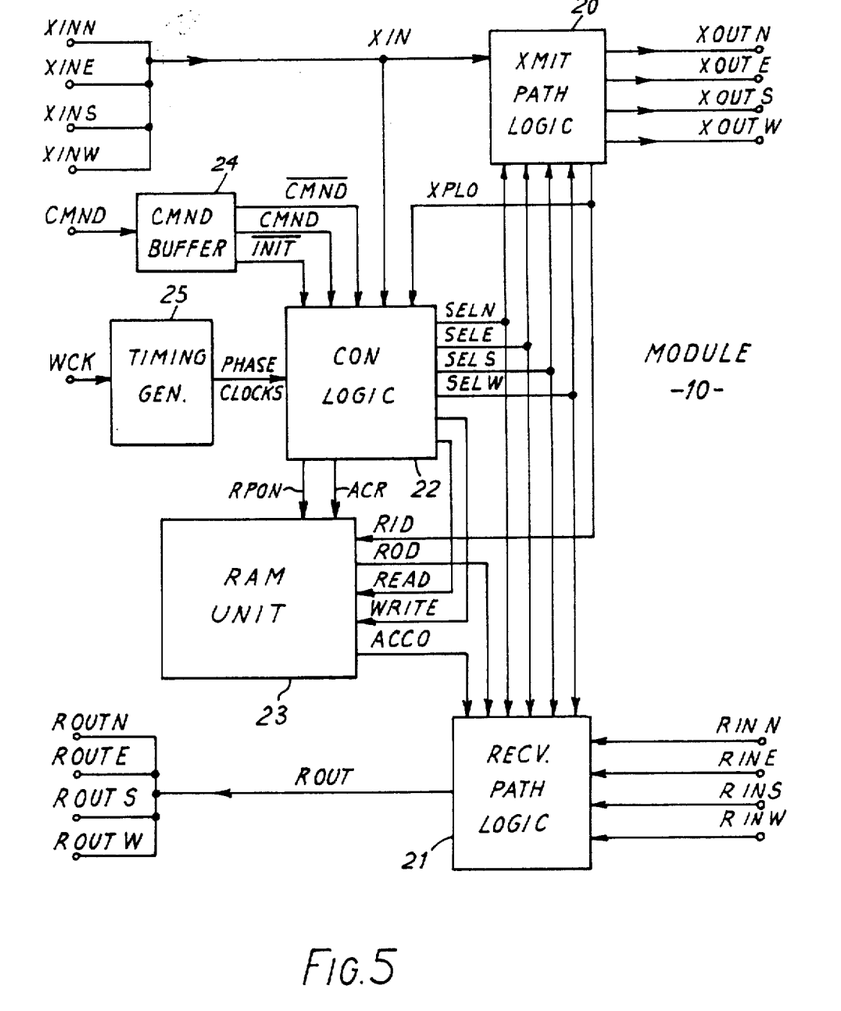
FIG. 5 is a general block diagram of a module.

FIG. 5 is a block diagram of one module. The four XIN terminals merge into XIN which forms the input to XMIT PATH LOGIC 20, within which the switching takes place to route the XMIT path to XOUTN, XOUTE, XOUTS or XOUTW. The four RIN terminals enter RECV PATH LOGIC 21 which selects one RIN terminal for connection to ROUT which branches to the four ROUT terminals.

XIN is also connected to CON LOGIC 22 (configuration logic) which decodes commands and provides the above-mentioned selection signals SELN, SELE etc and other commands, including READ and WRITE commands for a RAM UNIT 23. The command line CMND is fed to a clocked buffer 24 which provides complementary signals CMND (designating command mole) and CMND BAR (designated "transmit mode"). Basically, in transmit mode the module acts simply as a link in the chain passing on both outward bound XMIT path data and inward bound RECV path data. In command mode the module detects whether a command token is present in its XMIT path logic and, if it is, decodes and obeys the command addressed thereto, i.e. timed to provide a token bit in that module when CMND goes true.

CMND, CMND BAR and signals in general are gated with clock signals (described below) as is conventional in MOS circuits. For simplicity this design detail is ignored in the present description.

The buffer 24 also detects a global reset signal (CMND true for just one clock period) and generates an internal initialization signal INIT BAR (i.e. initialization asserted when the signal is false). This is readily detected by logic which generates INIT BAR in response to the state sequence TMODE, CMODE, TMODE in successive clock periods. The initialization is global because INIT BAR is generated by every module, regardless of what is received at XIN along the XMIT path itself. The use of global reset is described below.

The function unit of the module is a 16k RAM UNIT 23. In the presence of WRITE, 16k of data from the XMIT PATH LOGIC 20 is written into the RAM UNIT via a line RID (RAM input data). In the presence of READ, 16k of data is passed to the RECV PATH LOGIC 21 via a line ROD (RAM output data).

A timing pulse generator 25 provides multiphase timing pulses PHASE CLOCKS in response to WCK. Although PHASE CLOCKS are shown connected only to CON LOGIC 22, they are of course distributed to the module circuits generally.

A module has seven mutually exclusive states as follows:

| | |
|---|---|
| SELN  | asserted (link to module above) |
| SELE  | asserted (link to module to right) |
| SELS  | asserted (link to module below) |
| SELW  | asserted (link to module to left) |
| READ  | asserted |
| WRITE | asserted |
| RESET | (none of the above asserted). |

The CON LOGIC also provides a signal RPON (RAM power on) to switch on the RAM power supply. RPON is reset by INIT BAR and can be toggled by a command addressed to a module. Another command provides a strobe ACR (address counter reset) to the RAM UNIT 23 to reset its address counter at the instant of the strobe.

The RAM UNIT 23 is not essential to the operation of a module as a link in a chain. It can be independently switched on and off by means of RPON. Thus the chain of "good" modules can be grown having regard to the operability of the control logic 20, 21, 22, 24, 25. If a module is encountered with bad control logic, the chain will have to be retracted and a new module in a different direction tried. This will be the situation at the edge of the wafer; a non-existent module will inevitably appear to be bad. The control logic is permanently connected to the power lines but is of small area and defects are unlikely to affect wafer yield much. However the RAM UNIT, if faulty, could draw heavy current and collapse the voltage on the power tracks 11 and 12 to which it is connected, so affecting large numbers of neighbouring modules.

Figure 6:
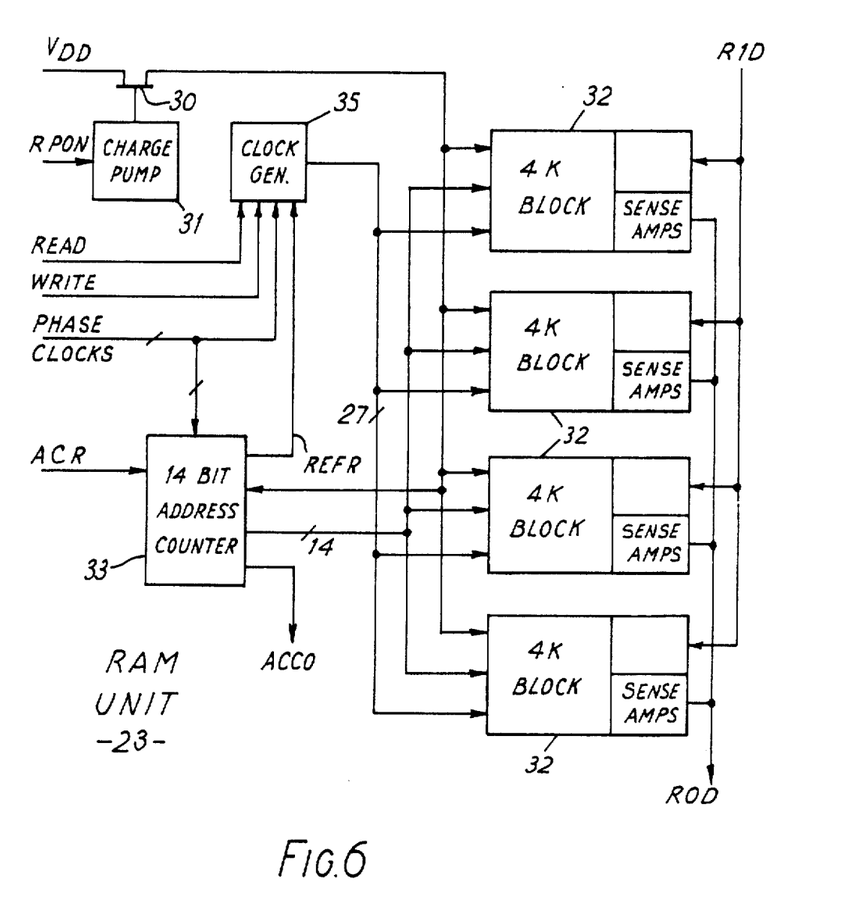
FIG. 6 is a block diagram of a memory unit forming the function unit of a module.

As shown in FIG. 6, the RAM UNIT 23 includes a switching transistor 30 which is controlled by RPON via a charge pump 31 which turns the transistor 30 on hard when RPON is true and connects $V_{DD}$ to four 4k RAM blocks 32 and a free-running, 14 bit address counter 33 ($2^{14} = 16384$) which can be reset by ACR for a purpose described below. The RAM data inputs are connected to the common input line MID (RAM input data) which accepts data from the XMIT PATH LOGIC. The RAM sense amplifiers 34 are connected to the common output line ROD (RAM output data) which passes data to the RECV PATH LOGIC.

The detailed management of the RAM's is effected conventionally by a clock generator 35 which receives the PHASE CLOCKS, READ and WRITE and effects precharge, discharge, refresh and so on, in a manner which need not be described here. However it should be noted that the counter 33 comprises a 7-bit column counter (least significant half) and a 7-bit row counter (most significant half). Every time a carry propagates from the column counter to the row counter, a signal REFR is given to the clock generator 35 and the currently addressed row is refreshed in well known manner. Thus refresh takes place every 128 ($2^7$) clock pulses and a cycle of 128×128 clock pulses is required to refresh all rows of the RAM blocks 32.

The purpose of ACR is to enable the address counters 33 in the various modules to stagger their refresh cycles so that only a few RAM UNITS 23 are refreshing in any one clock period. This avoids excessive demands on the power lines and introducing of noise spikes.

The address counter carry bit is denoted ACCO (address counter carry out) and this may also be utilized in one test facility to be described below.

Figure 7:
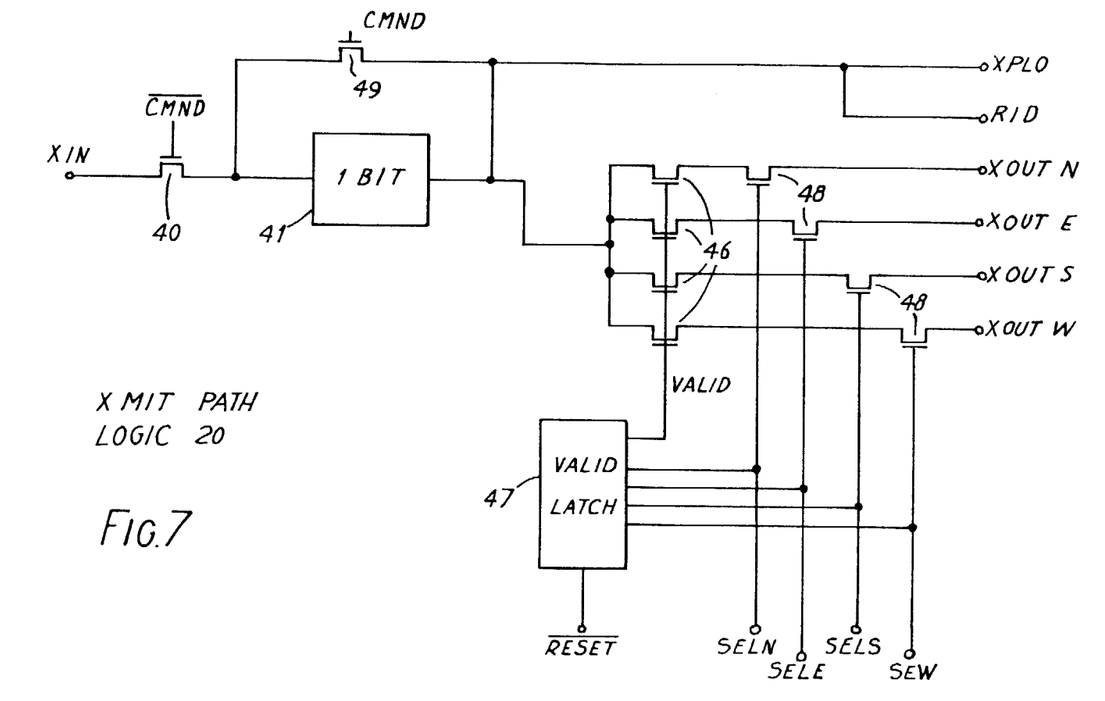
FIGS. 7 and 8 are circuit diagrams of transmit and receive path logic respectively.

FIG. 7 is a detailed diagram of the XMIT PATH LOGIC 20. XIN is connected through an FET 40 enabled by CMND BAR to a clocked 1-bit stage 41, from which drive is provided to the XOUT lines. Each such line includes a first FET 46 which is normally enabled by a validation latch 47 and a second FET 48 of which only one is enabled by the corresponding signal SELN, SELE, SELS or SELW. The validation latch 47 provides a safety feature. As will be described below, when a command is addressed to a module or INIT BAR is asserted, the CON LOGIC asserts a reset signal RESET BAR which resets any SEL signal which is set. Failure for this to take place is a recipe for disaster. If one SEL signal remains erroneously asserted when another is subsequently commanded, it is possible to have the chain branching from one module in an uncontrolled manner. This state of affairs is precluded by the validation latch 47 which is enabled by RESET BAR and normally (with all of SELN to SELW false) latches the state which provides VALID and so enables all of the FET's 46. However, if any of SELN to SELW is true, the other state is latched to disable the FET's 46.

This will prevent the module in question being used to add any other module to the chain, i.e. it becomes a totally bad module and during the chain growth and test phase, the chain will be retracted and re-routed to avoid this module.

When the module is merely being used as a link in the chain and CMND BAR is accordingly asserted, XIN is connected to one of XOUTN, XOUTE, XOUTS, XOUTW through FET 40, 1-bit stage 41, one of the FETs 46 and whichever of the FETs 48 is enabled.

When the module is writing data to the RAM UNIT 23, CMND BAR is again asserted and the data passes through the FET 40 and 1-bit stage 41 to RID.

The output of the 1-bit stage 41 is fed back to the input of the stage through an FET 49 which is enabled by CMND to form a 1-bit latch which latches the bit therein at the time CMND is asserted. This output is XPLO (transmit path latch out), which is physically the same as RID. XPLO is what tells the CON LOGIC 22 whether the module in question is addressed or not when CMND is asserted.

Figure 8:
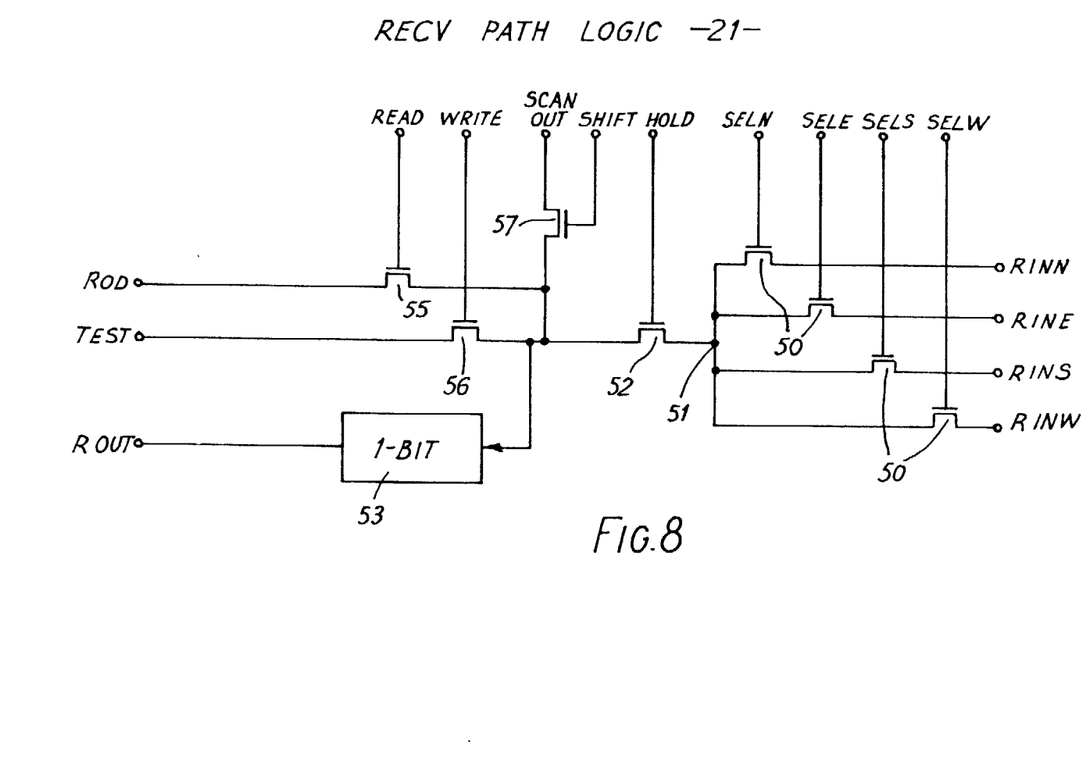

FIG. 8 shows the RECV PATH LOGIC 21. RINN, RINE, RINS and RINW are connected through respective FET's 50 to a node 51. The FETs 50 are enabled by SELN, SELE, SELS and SELW respectively. The node 51 is connected through an FET 52 enabled by HOLD and a clocked 1-bit stage 53 to ROUT. The function of HOLD will be explained below but, for understanding of FIG. 8 it suffices to know that it is true consequent on CMND BAR is true, so that the module is established as a link in the chain, connecting the correct one of RINN to RINW to ROUT.

In order to transfer data from the RAM UNIT 23 to the RECV path, ROD is connected to the input of the 1-bit stage 53 through an FET 55 enabled by READ. As one test facility a terminal TEST is connected to the input of the 1-bit stage 53 through an FET 56 enabled by WRITE. TEST may be connected to RID (FIG. 7) so that when a write operation is performed, the data sent to the module in question along the XMIT path is returned from that module along the RECV path. The returned data can then be checked against the transmitted data. This may be useful as part of data verification procedures during normal use of the configured wafer.

Another use of TEST is implemented by connecting it to ACCO (FIG. 6). Then, during a write operation, a pulse should be injected into the RECV path every 16k clock pulses. This may be useful to test the address counter 33 during the initial configuration procedures.

A further test facility, to be explained below is provided by a terminal SCAN OUT connected to the input to the 1-bit stage 53 through an FET 57 which is enabled by a signal SHIFT which is complementary to HOLD.

Figure 9:
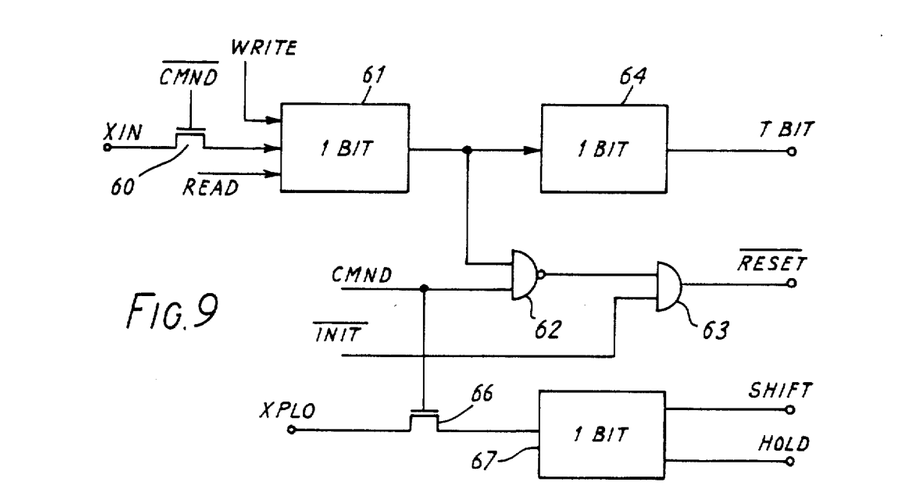
FIGS. 9 and 10 are circuit diagrams of two portions of the configuration logic of a module.

The CON LOGIC 22 will now be described. FIG. 9 shows one part of this circuit which generates the above mentioned signals RESET BAR, HOLD and SHIFT and a signal TBIT which is a token bit to be shifted along a shift register described with reference to FIG. 10. XIN is connected through a FET 60 enabled by CMND BAR to a 1-bit stage 61. WRITE and READ are also connected to the stage 61 which performs an OR function. The output of the 1-bit stage 61 is gated in a NAND gate 62 with CMND to provide RESET BAR which is also provided in response to INIT BAR by an AND gate 63.

The operation of this part of the circuit is as follows. If, in transmit mode, XIN provides a 1-bit it is buffered in the 1-bit stage 61. If CMND is asserted before the next clock pulse, the output of the NAND gate 62 goes false to force the output of the AND gate 63 false and thus assert RESET BAR. RESET BAR is asserted willy-nilly if INIT BAR is asserted, because this also forces the output of the AND gate 63 false.

The output of the 1-bit stage 61 is buffered for one more bit time by a stage 64 to provide TBIT (token bit) which is a bit to be clocked down the shift register (FIG. 10) so long as CMND is asserted. It should be noted that RESET BAR can only be asserted and TBIT generated when (1) the transmit path latch 41 contains a 1-bit when CMND is asserted or (2) READ or WRITE is asserted when CMND is raised, irrespective of the contents of the transmit path latch. Case (1) represents the normal way of addressing a command to a module: asserting CMND at the time a 1-bit is present in the module on the XMIT path. Case (2) provides a means of aborting a WRITE or READ operation.

As explained above XPLO will be latched at 1 in an addressed chip. As shown in FIG. 9, XPLO is applied to a 1-bit stage 67 through an FET 66 enabled by CMND to provide SHIFT which enables the above-mentioned shift register in order to clock TBIT along the register until CMND ceases to be asserted, and complementary signal HOLD.

Detailed timing considerations are not entered into here but the general situation is that XPLO is one bit delayed relative to XIN and SHIFT is a further bit delayed relative to XPLO. RESET BAR is one bit delayed relative to CMND and TBIT is a further bit delayed. RESET BAR is thus generated off the same bit as is latched to form XPLO and one bit later, this same bit appears as TBIT to be clocked along the shift register with SHIFT true.

Figure 10:
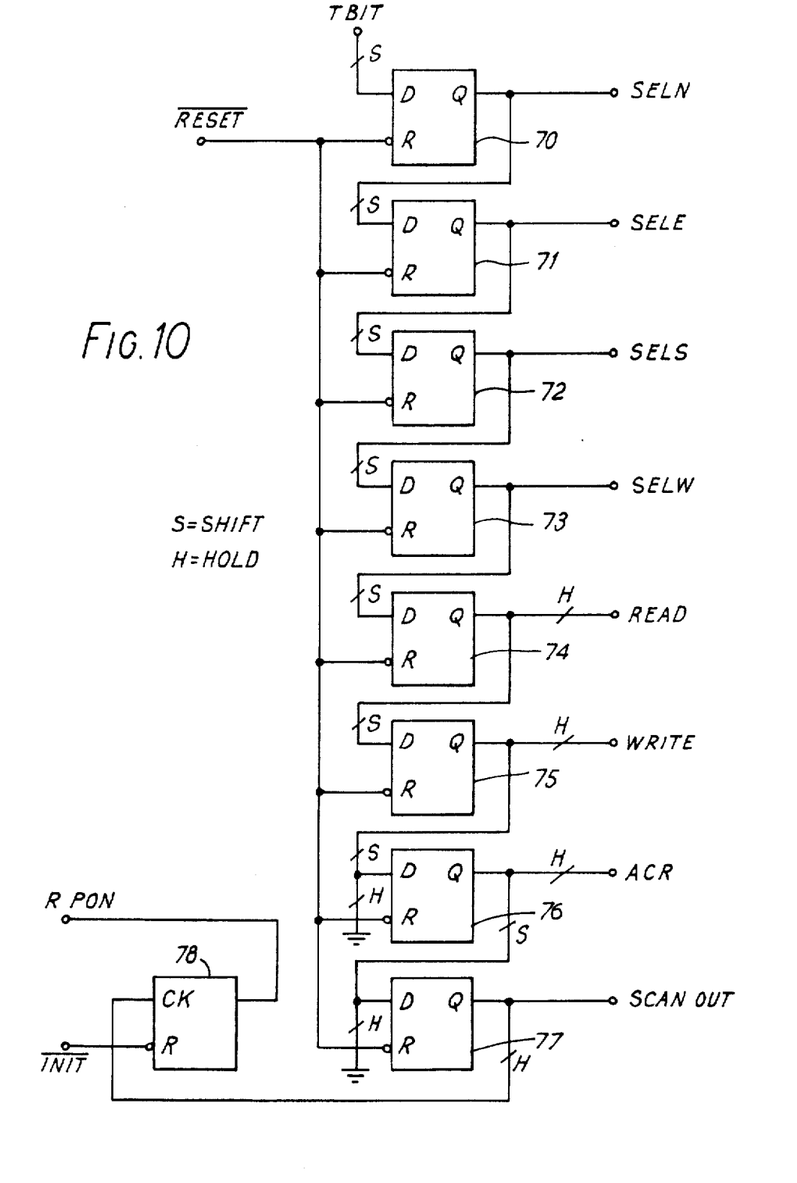

FIG. 10 shows the remainder of the CON LOGIC 22, consisting of a chain of eight clocked D-type flip-flops 70-77 forming the shift register and a T-type flip-flop 78. The passage of signals is controlled by gates symbolically represented by small strokes with an adjacent S, meaning enabled by SHIFT or an adjacent H, meaning enabled by HOLD. The flip-flops 70 to 75 provide SELN, SELE, SELS, SELW, READ and WRITE respectively. Assuming that the module in question is addressed it can be seen that these six flip-flops will first be cleared by RESET BAR. Then TBIT will be clocked from flip-flop to flip-flop for as long as SHIFT remains true. When SHIFT becomes false and HOLD becomes true, which is when CMND goes false, the TBIT is latched in whichever flip flop it has reached.

If a 1-bit is sent down the XMIT path and CMND is asserted in the period in which that bit enters a given module and is then held true for n clock periods, n=2 will cause TBIT to be latched in flip-flop 70 (SELN), n=3 will cause TBIT to be latched in flip-flop 71 (SELE) and so on.

If n=8, TBIT moves on to flip-flop 76 which provides ACR but does not stay latched because HOLD puts ground on the D input. Thus n=8 provides a means for resetting the address counter 33 of the RAM unit 23.

If n exceeds 9, TBIT then moves past the flip-flop 77 which provides SCAN OUT. SCAN OUT is injected into the RECV path as described with reference to FIG. 8 and can be detected at the RECV terminal. The provision of SCAN OUT is a demonstration that the CON LOGIC 22 (excluding the flip-flop 78) is functioning. Accordingly it is satisfactory to use the module in the chain of modules, whether or not its RAM UNIT is functional.

If n=9, the flip-flop 78 is toggled. This flip-flop provides RPON and is reset by the global initialization signal INIT BAR, The preferred way of configuring the system is to apply a global reset (CMND true for one clock period, i.e. n=1) to ensure that all flip-flops, especially the RPON flip-flops of all modules are reset. The first module M1 (FIG. 4) is then tested with n greater than 9 and if SCAN OUT is detected back at RECV, all is well. If not another M1 must be selected and for this purpose there are say four XMIT, RECV bondsites around the periphery of the wafer connected to different modules.

The first module M1 is then commanded with n=2 to latch SELN. In FIG. 4 there is no wafer above M1 so when the notionally added M2 is tested with n greater than 9, SCAN OUT will not appear. M1 is therefore commanded with n=3 to latch SELE. M2 is tested with n greater than 9 and SCAN OUT appears. M2 is therefore commanded with n=2 to add M3 which is tested with n greater than 9, and so on. The module address table is built up to record for each module what its selection direction is.

When the maximum usage of the modules has been effected in this way, the RAM UNITS 23 are powered and tested one by one, e.g. sequentially from M1 onwards. M1 is therefore commanded with n=9 to toggle the flip-flop 78 on and assert RPON. The module is then commanded with n=8 to reset the address counter 33 by ACR at the desired time relative to the datum address cycle time. The command resets SELE so the chain connected to XMIT again consists of M1 only although the more remote part of the chain remains intact. WRITE and READ are now employed using commands with n=7 and 6 respectively to see whether it is possible to write to the RAM UNIT 23 and reliably read back what was written.

If the module fails this test, it is commanded again with n=9 to toggle the flip-flop 78 again and set RPON false. Whether RPON is left true or set false, M1 is again commanded with n=3 to latch SELE and re-join the chain. M2 is now tested by using commands with n=9 (toggle RPON on), n=7 (WRITE) and n=6 (READ). RPON is toggled off if necessary and M2 is commanded with n=2 to latch SELN, whereafter the testing proceeds to, M3 and so on.

During this phase the aforementioned table is set up with its OFFSET and FLAG entries.

Figure 11:
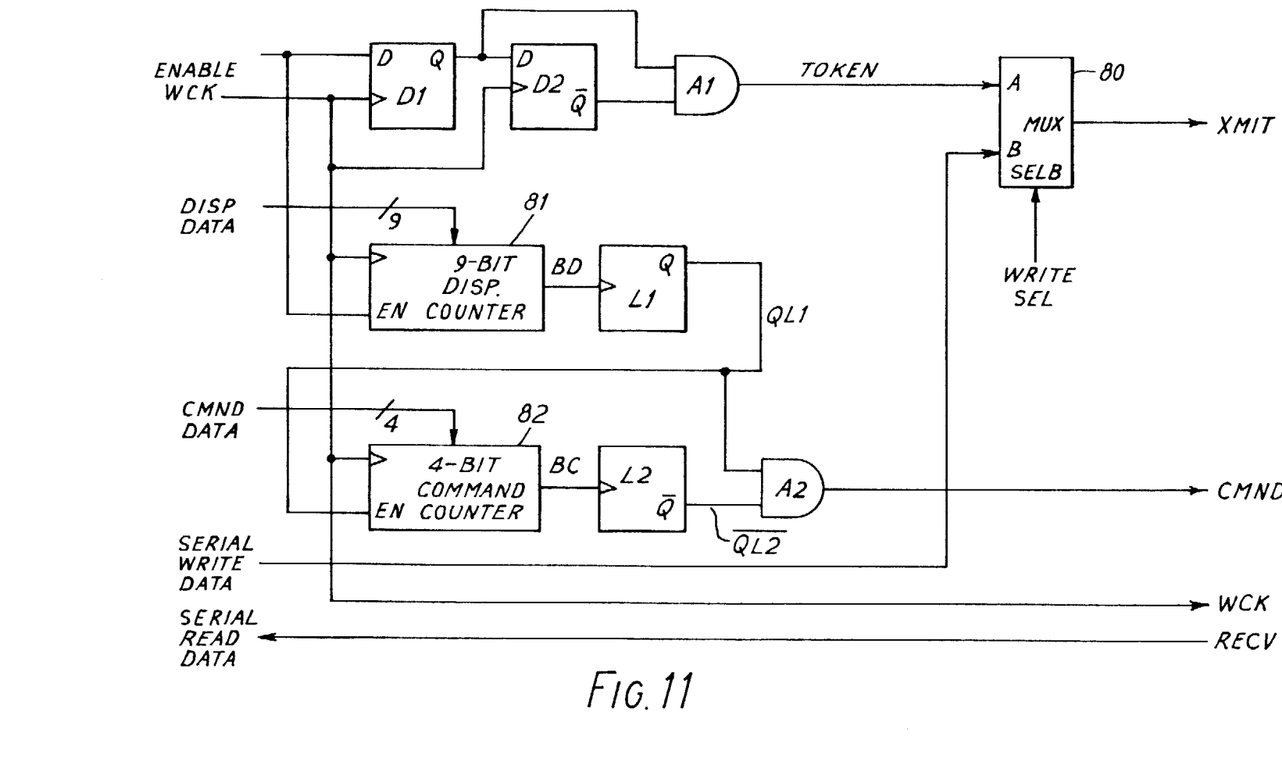
FIG. 11 is a block diagram of a circuit for sending commands to modules.

FIG. 11 shows the control circuitry for controlling the addressing of the modules. This circuitry may be off the wafer and interfaces with a control processor (not shown) which provides the necessary data and a strobe signal ENABLE which initiates a command operation. This processor stores the aforementioned table to enable it to time ENABLE and SERIAL DATA correctly.

Figure 12:
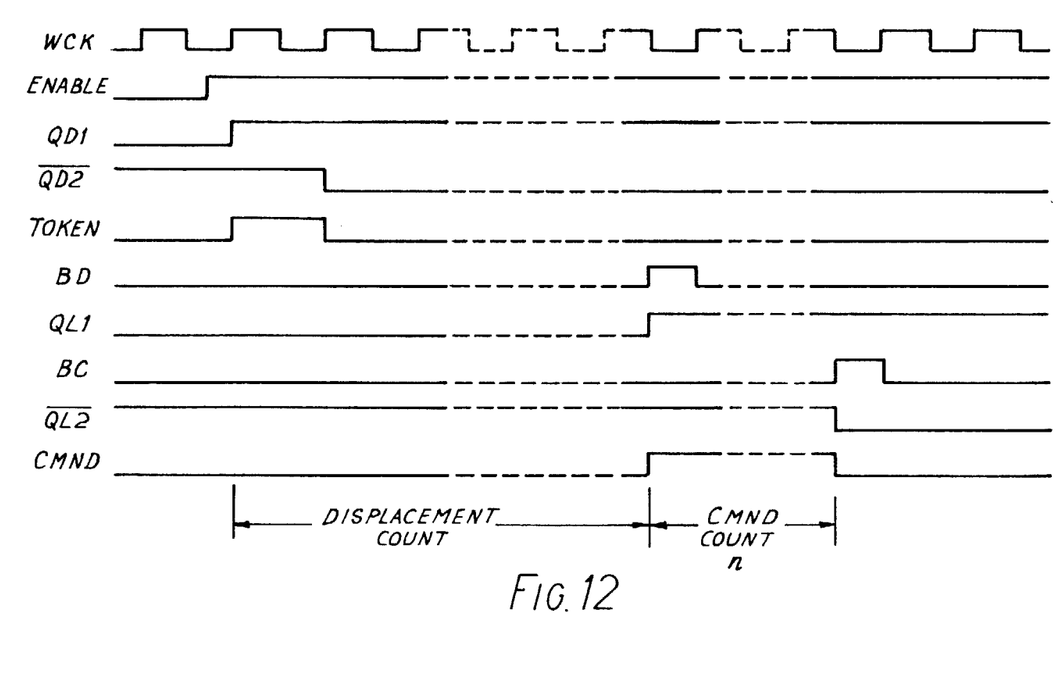
FIG. 12 shows explanatory waveforms pertaining to FIG. 11.

When ENABLE goes true (see also FIG. 12) it generates a 1 bit TOKEN via flip-flops D1 and D2, whose outputs QD1 and QD2 BAR are shown in FIG. 12, and an AND gate A1. The TOKEN is applied to XMIT via a multiplexer 80. ENABLE also enables (EN terminal) a 9-bit displacement counter A2 which is used to count the number of clock pulses to the module to be addressed. A 9-bit counter will handle a chain of up to 512 modules. The counter 81 will have been preset by the control processor with the correct initial value denoted DISPLACEMENT DATA and, when enabled, counts clock pulses WCK until a terminal count BD is reached. BD is latched in a latch L1 whose output QL1 enables a second counter 82 and also initiates CMND via an AND gate A2. The counter 82 is a 4-bit command counter present in accordance with the desired duration of CMND by CMND DATA. When this counter reaches its terminal count BC a second latch L2 latches BC and the QL2 BAR output of this latch disables the gate A2, so terminating CMND. A 4-bit counter 82 suffices to set up all desired durations of CMND from n=1 clock period (global reset) up to n=10 clock periods as required by the CON LOGIC 22 of FIG. 10.

Although not illustrated, QL2 BAR may be used to reset the. latches D1, D2, L1, L2.

When a WRITE command is set up, the controlling processor must feed the serial data to XMIT after CMND has gone low again and in doing this it applies a signal WRITE SEL to the multiplexer 80 to connect SERIAL WRITE DATA to XMIT". When a READ command is set up, the controlling processor must be ready to accept serial read data from RECV m clock pulses after the termination of CMND, where m corresponds to the displacement of the addressed module from RECV.

For simplicity and in order to avoid a greater risk of anomolous conditions it is preferred to assert CMND when there is only a single TOKEN bit on the XMIT path. If more than one bit is on the path, multiple addressing will occur, with the same command given to all addressed modules, because this is determined by the duration of CMND. A single TOKEN bit can be used to address a plurality of modules in sequence. The bit is latched in the latch 41, 42 (FIG. 7) and, when a command is terminated at one module, can continue to another module, which is addressed when CMND is asserted, provided the one module is in a state with one of its SEL signals asserted.

There are three reset modes for a module. As explained above, raising CMND for one clock period only asserts INIT BAR in all modules, clearing the shift register stages 70–77 (FIG. 10) in all modules and also lowering RPON in all modules. Secondly, there is an addressed reset in that RESET BAR is asserted in just the addressed module to clear the shift register stages 70 to 77 before the token TBIT is shifted in. Thirdly, these shift register stages are cleared if CMND is raised while the module is set to READ or WRITE, by virtue of the connections to amplifier 61 in FIG. 9. This is termed "operation reset" and may be used in various ways called termination with onward addressing (TOA), termination with path closure (TPC) and ABORT.

TERMINATION WITH ONWARD ADDRESSING (TOA). In the case of the WRITE operation, a '1' is appended to the end of the write data stream so that, when CMND is raised AT THE END of the write operation, the module performing the write sees a '1' in its XMIT path latch. The module is therefore once again an addressed module; raising CMND resets the shift register 70–72, so terminating the write operation and a new onward path from the module may then be selected, by keeping CMND high for the appropriate number of clock pulses. In the case of the READ operation, a similar scheme pertains, save that in this case the command token must be injected into the XMIT path at such a time that it arrives at the target chip when or after the last bit of data is being read out on to the RECV path.

TERMINATION WITH PATH CLOSURE (TPC). In this case the XMIT path latch of the target module contains a '0' when the CMND line is raised at the end of the READ or WRITE operation. Raising the CMND line resets the shift-register, terminating the current operation. Unlike TOA, there is no command token present to generate an onward path. TPC will be used with a command token set at some module nearer XMIT so that, when CMND is raised, a new path will be configured from THAT chip, or a read or write operation will be set up there.

ABORT. If CMND is raised at any time prior to the end of a complete read or write operation, that operation will immediately be terminated. A graceful ABORT from a READ operation may be made by ensuring that the XMIT path is flushed with '0's prior to the abort. A TOA- or TPC-like ABORT prior to the end of a READ operation is possible by injecting a single '1' into the flushed XMIT path. It is more difficult to abort a WRITE operation gracefully as multiple module addressing will generally occur due to the presence of multiple '1's in the XMIT path write data stream when CMND is raised. A possible solution is to keep CMND high for long enough to ensure that all tokens passing through the shift register 70–77 are scanned out on to the RECV path. The outputs of the shift registers 70–77 are therefore effectively when the CMND line is eventually lowered. It should be realised, however, that in this case all chip-to-chip connections are broken and will have to be reestablished at some later time. Note that GLOBAL RESET should NOT be used in place of an ABORT, as a global reset will cause all RAM power supplies to be switched off, thereby losing all the data on the wafer.

I claim:

1. A system of circuit modules connected in a chain, each module having an input terminal and an output terminal connected to said input terminal of the next module in the chain, each module including a function unit for operating on data and control means for causing the module to execute selected ones of a repertoire of commands, said control means of each module including serial logic connected from said input terminal to said output terminal of said module, for passing digital signals from module to module, said control means of each module comprising a shift register arrangement comprising a series of shift register stages, at least one of which is included within said serial logic and said system comprising a source of clock pulses distributed to all said shift register arrangements for clocking digital signals therethrough, a power supply source connected to all modules, means for launching a token consisting of at least one bit into said chain to be clocked by said clock pulses along said serial logic of said modules in sequence, a global command line extended to said control means of all said modules for the application of global command signals substantially simultaneously to all said control means, and means for applying a first command signal to said global command line at a predetermined time after said token was launched and, when said token is present in said serial logic of a selected module, said control means being responsive to receipt of said first command signal coincidentally with the presence of said token to execute a first selected one of said repertoire of commands.

2. A system according to claim 1, wherein said shift register arrangement of each module further comprises at least one stage branching off said serial logic to form a branch portion of said shift register arrangement, and wherein said first selected command executed in said selected module causes said token to be diverted from said serial logic into said branch portion to be clocked therealong by said clock pulses.

3. A system according to claim 2, wherein said serial logic of each module carries both tokens and data sent to the modules.

4. A system according to claim 2, wherein said serial logic of each module provides a single bit delay per module through said chain.

5. A system according to claim 2 wherein said control means of each module is responsive to a second command signal applied to a global command line to execute one of said repertoire of commands determined by the position of said token in said branch portion logic at the time of occurence of said second command signal.

6. A system according to claim 5, wherein both said first and second commands are applied to the one said global command line.

7. A system according to claim 6, wherein said first and second command signals are given by the assertion and termination respectively of a predetermined signal level on said global command line.

8. A system according to claim 7, wherein each said shift register arrangement includes a stage for toggling a power supply control signal which determines whether or not power is supplied from said power supply source to circuits of said function unit and wherein each module further comprises circuit logic responsive to assertion of said predetermined signal level on said global command line for a predetermined minimum duration to reset said power supply control signal, whereby such assertion removes the power supply from function unit circuits of all modules.

9. A system according to claim 5, wherein said token is a single token bit and said control means are responsive to said token bit latched in a particular stage of said shift register arrangement on receipt of said second command signal to determine which of said repertoire of commands is executed.

10. A system according to claim 9, wherein said control means is operative to reset at least some stages of said shift register arrangement before said token is clocked along said shift register arrangement.

11. A system according to claim 10, wherein said control means of each module includes configuration logic whereby that logic can select one of a plurality of neighboring modules as the next module in said chain, and wherein said repertoire of commands includes commands to the configuration logic for effecting the selection, and further comprising means adapted to disable said configuration logic if any one of the neighbouring modules remains selected after said reset.

12. A system according to claim 1, wherein each said shift register arrangement includes a stage for toggling a power supply control signal which determines whether or not power is supplied from aid power supply source to circuits of said function unit.

13. A system according to claim 1, wherein said function unit is a memory unit, said chain includes an outbound path comprising said serial logic and along which tokens and data may be sent and an inbound path along which data may be returned, and wherein the repertoire of commands includes a write command to which said control means is responsive to connect said inbound path to said memory unit for writing data into said memory unit, and a read command to which said control means is responsive to connect said outbound path to said memory unit for reading data from said memory unit.

14. A system according to claim 13, wherein said memory unit of each module includes a free running address counter for addressing locations into which the data is written or from which the data is read.

15. A system according to claim 14, wherein said shift register arrangement includes a stage for providing a reset signal to said address counter.

16. A system according to claim 1, wherein said control means of each module includes configuration logic whereby that module can select one of a plurality of neighbouring modules as the next module in said chain, and wherein said repertoire of commands includes commands to the configuration logic for effecting the selection.

17. A system according to claim 1, wherein the modules are an array of integrated circuits on a wafer.

18. A wafer-scale integrated circuit memory system including a plurality of circuit modules on a wafer, each module including a random access memory unit addressed by a free-running counter and having a data output and a data input, an outbound data path having an input and an output whereby data maybe sent through the module to another module, an inbound data path having an input and an output whereby data maybe sent back through the module from another module, configuration logic for selecting which of a set of neighbouring modules is connected to said outbound data path to receive data sent on the outbound data path and is connected to said inbound data path input to act as the source of data sent back on the inbound data path, said input of said outbound data path being connected to the outputs of the outbound data paths of said set of neighbouring modules and said output of said inbound data path being connected to the inputs of the inbound data paths of said set of neighbouring modules, and control means operable to select between a plurality of mutually exclusive states, namely, a set of first states in one-to-one correspondence with the said neighboring modules for causing said configuration logic to select a neighbouring module, a read state in which a connection is enabled between said data output of said memory unit and said inbound data path to pass read data to said inbound data path output from the addresses of said random access memory unit addressed by said free-running counter during the continuance of said read state and a write state in which a connection is enabled between said data input of said memory unit and said outbound data path to receive write data from said outbound data path input for writing into the addresses of said random access memory unit addressed by said free-running counter during the continuance of said write state, wherein said control means comprise a shift register having a plurality of stages corresponding to said states respectively, and the presence of a bit in one of said stages selects a corresponding one of the said stages, said system further comprising means for launching a token bit at said outbound data path input of a first one of said modules, a global command line connected to all modules and means for applying a command signal to said global command line a predetermined time after said token bit is launched, and wherein each said control means is responsive to said command signal to clock said token bit down said shift register of that module in which said token bit is present on said outbound line thereof when said command signal goes from a datum level to an active level and to cease clocking said token bit down said shift register when said command signal resets to said datum level.

19. An array of circuit modules connectable in a chain, each module having a set of input terminals and a set of output terminals each said output terminal being connected to one of said input terminals of an adjacent module in said array, each module including a function unit for at least storing data, switching means for selecting one of said output terminals and control means for causing the module to execute selected ones of a repertoire of commands, said control means comprising first logic means through which said input terminals are connected to said switching means and second logic means including a shift register, said system further comprising a source of clock pulses distributed to said shift registers of all said modules for clocking digital signals therethrough, a power supply source connected to all modules, means for launching a token consisting of at least one bit into one of said module inputs to be clocked by said clock pulses through said first logic means to said switching means of said modules in sequence, a global command line extended to said control means of all said modules for the application of global command signals substantially simultaneously to all said control means, and means for asserting a command signal on said global command line at a predetermined time after said token was launched and for terminating the assertion of said command signal after a predetermined delay, said first logic means being responsive to assertion of said command signal when said token is present in said first logic means to start a command bit clocking through said stages of said shift register, until said command signal ceases to be asserted after said predetermined delay, said stages of said shift register corresponding to said commands respectively of said repertoire and said control means comprising means operative when said command signal ceases to be asserted to implement said command corresponding to that one of said shift register stages in which said command bit has stopped.

20. An array of circuit modules according to claim 19, wherein said commands include commands in one to one correspondence with said output terminals, each said command operating said switching means to select said corresponding output terminal.

21. A system of circuit modules connected in a chain, each module having an input terminal and an output terminal connected to said input terminal of the next module in the chain, each module including a function unit for at least storing data and control means for causing the module to execute selected ones of a repertoire of commands, said control means of each module comprising a shift register arrangement having a series of shift register stages and said system comprising a source of clock pulses distributed to all said shift register arrangements for clocking digital signals therethrough, a power supply source connected to all modules, means for launching a token consisting of at least one bit into said chain to be passed from said input terminal to said output terminal of said modules in sequence, a global command line extended to said control means of all said modules for the application of global command signals substantially simultaneously to all said control means, and means for applying a command signal to said global command line at a predetermined time after said token was launched and, when said token is passing through a selected module, said control means being responsive to receipt of said command signal coincidentally with the presence of said token to start clocking a command bit through said shift register stages, to arrest said command bit when said command signal terminates and to execute a selected one of said repertoire of commands in dependence upon which of said shift register stages said command bit has been arrested in.

* * * * *